United States Patent
Hughes

(10) Patent No.: US 7,609,059 B2
(45) Date of Patent: Oct. 27, 2009

(54) MAGNETIC RESONANCE METHOD AND APPARATUS WITH NUCLEAR SPINS TYPE-SPECIFIC SIGNAL SUPPRESSION

(75) Inventor: Timothy Hughes, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/046,807

(22) Filed: Mar. 12, 2008

(65) Prior Publication Data
US 2008/0224699 A1 Sep. 18, 2008

(30) Foreign Application Priority Data
Mar. 12, 2007 (DE) .................. 10 2007 011 807

(51) Int. Cl.
*G01V 3/00* (2006.01)
(52) U.S. Cl. ................................ 324/307; 324/309
(58) Field of Classification Search ............. 324/307, 324/309
See application file for complete search history.

(56) References Cited

U.S. PATENT DOCUMENTS

| 5,256,967 | A | 10/1993 | Foo et al. |
| 5,404,882 | A | 4/1995 | Santyr |
| 5,429,134 | A | 7/1995 | Foo |
| 5,541,514 | A | 7/1996 | Heid et al. |
| 5,633,586 | A | 5/1997 | Finn |
| 6,885,193 | B2 | 4/2005 | Foxall |
| 6,922,054 | B2 * | 7/2005 | Hargreaves et al. ......... 324/307 |
| 7,071,689 | B2 | 7/2006 | Golay et al. |
| 7,151,370 | B1 * | 12/2006 | Hargreaves ............... 324/307 |
| 7,253,620 | B1 * | 8/2007 | Derbyshire et al. ......... 324/307 |
| 2004/0004476 | A1 * | 1/2004 | Overall ...................... 324/309 |
| 2008/0272778 | A1 * | 11/2008 | Cukur et al. ............... 324/309 |
| 2009/0027051 | A1 * | 1/2009 | Stuber et al. ............... 324/309 |

OTHER PUBLICATIONS

"Design of Adiabatic Pulses for Fat-Suppression Using Analytic Solutions of the Bloch Equation," Rosenfeld et al, Magnetic Resonance in Medicine, vol. 37 (1997), pp. 793- 801.
"Fast and Precise $T_1$ Imaging a TOMROP Sequence," Brix et al, Magnetic Resonance Imaging, vol. 8 (1990), pp. 351-356.
"Design of Selective Adiabatic Inversion Pulses Using the Adiabatic Condition," Rosenfeld et al, J. of Magnetic Resonance, vol. 129 (1997), pp. 115-124.

* cited by examiner

*Primary Examiner*—Louis M Arana
(74) *Attorney, Agent, or Firm*—Schiff Hardin LLP

(57) ABSTRACT

A method in the form of a sequence for magnetic resonance imaging with which image data of a subject to be examined are acquired and with which signals of nuclear spins of a specific type are suppressed, includes the steps of (a) application of a suppression module to suppress signals of the nuclear spins of the specific type, (b) application of an acquisition module after a wait time to acquire measurement data, (c) repetition of the steps (a) and (b) one or more times, respectively after a repetition time and, (d) before the steps (a), (b) and (c), application of a spin preparation module that shifts a magnetization of the nuclear spins of the specific type into a steady state condition that is maintained through the application of the subsequent steps (a), (b) and (c). Alternatively, instead of the spin preparation module the first suppression module can be fashioned such that it has an RF pulse with a flip angle selected such that the magnetization of the nuclear spins of the specific type is shifted into a steady state condition.

19 Claims, 6 Drawing Sheets

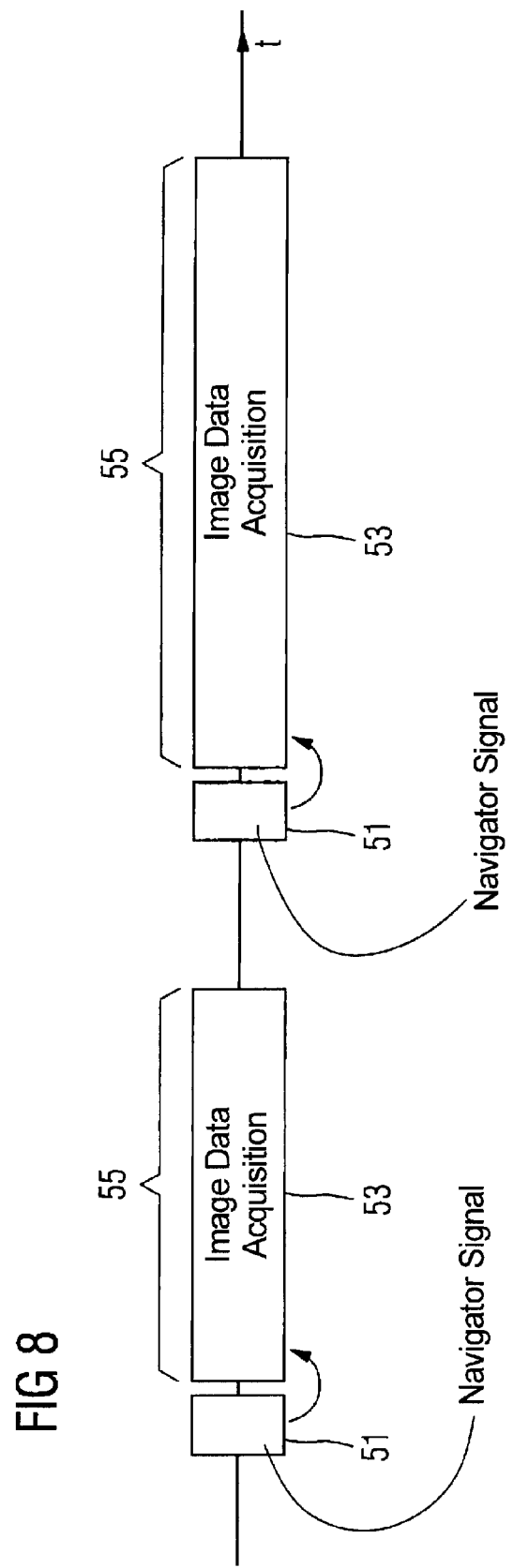

MAGNETIC RESONANCE METHOD AND APPARATUS WITH NUCLEAR SPINS TYPE-SPECIFIC SIGNAL SUPPRESSION

BACKGROUND OF THE INVENTION

1. Field of the Invention

The present invention concerns the field of magnetic resonance imaging (MRI) particularly as applied in medicine for examination of patients. The present invention in particular concerns operating methods in the form of sequences for MRI in which signals that originate from nuclear spins of a specific tissue type are suppressed. For example, sequences that suppress fat tissue are among such sequences. Furthermore, the present invention concerns a magnetic resonance apparatus for implementation of such a sequence.

2. Description of the Prior Art

MR technology is a technology known for some decades with which images of the inside of an examination subject can be generated. The examination subject is positioned in a strong, static, homogeneous basic magnetic field (field strengths of 0.2 Tesla up to 7 Tesla and more) in an MR apparatus so that the subject's nuclear spins orient along the basic magnetic field. Radio-frequency excitation pulses are radiated into the examination subject to trigger nuclear magnetic resonance signals, the triggered nuclear magnetic resonance signals are detected and MR images are reconstructed based thereon. Rapidly switched magnetic gradient fields are superimposed on the basic magnetic field for spatial coding of the measurement data. The acquired measurement data are digitized and stored in a k-space matrix as complex numerical values. An associated MR image can be reconstructed from the k-space matrix populated with values by means of a multi-dimensional Fourier transformation. The temporal sequence of the excitation pulses and the gradient fields for excitation of the image volume to be measured, for signal generation and for spatial coding is thereby designated as a sequence (or a pulse sequence or measurement sequence).

In the acquisition of image data it often occurs that nuclear spins of a specific tissue type (for example fat tissue) emit a strong signal. Fat tissue is imaged very intensely in the generated images in comparison to other tissue types, such that a correct diagnosis is made more difficult. Techniques have therefore been developed in order to suppress the signal arising from fat tissue.

One of these techniques is known as "inversion recovery" (designated as IR in the following). In this technique a pulse known as an IR pulse is used that is radiated in a module known as a suppression module. The application of the IR pulse inverts the longitudinal magnetization of the nuclear spins that thereupon again approach their initial position (i.e. the alignment parallel to the B0 magnetic field) in an exponential curve with a time constant T1. This inversion can ensue slice-selectively or throughout the entire excitation pulse volume of the transmission coil.

The time constant T1 of fat tissue is shorter than the time constants of many other tissues. An acquisition module, in which the actual acquisition of the measurement data occurs, is implemented after a matching selected time duration TI (TI for "inversion time"), the longitudinal magnetization of nuclear spins of fat tissue being located precisely at the zero crossing at the point in time of the acquisition of the measurement data, such that these nuclear spins generate no signals. Such a technique is also designated as STIR ("short time inversion recovery").

Another technique makes use of a saturation of nuclear spins of a specific type, for example of fat tissue protons. Since protons of fat tissue and of water have slightly different resonance frequencies, it is possible to excite predominantly fat tissue protons with a specific RF pulse and to thereupon destroy (dismantle) the generated signal with a gradient pulse (what is known as a spoiler gradient). This suppression of the signal of the protons of the fat tissue is often designated as a "saturation", a term that originates from MR spectroscopy. The longitudinal magnetization of water protons is largely retained by the saturation pulse. When the data acquisition with an acquisition module ensues after a suppression module with the specific RF saturation pulse, the acquired signals originate only at a small portion of nuclear spins of the fat tissue.

Instead of signals that originate from fat tissue, signals that originate from nuclear spins of another tissue type can be suppressed with analogous techniques.

In both cases, acquisition modules that follow suppression modules are respectively executed. As is typical in MRI the acquisition of the image data often ensues via repeated execution of acquisition modules, with different parts of the measurement data are acquired in each acquisition module. In this case an IR pulse with a time offset of TI is radiated before each acquisition of the measurement data. This requires a rapid repetition of the suppression modules, for example with repetition times in the range of several tens of milliseconds.

As soon as the repetition time lies on the order of the relaxation time T1 for fat tissue or less, the state of the magnetization of the fat tissue protons changes upon each execution of a suppression module and only after a certain number of suppression modules does an equilibrium state ("steady state condition") occur for the longitudinal magnetization of the nuclear spins of the fat tissue protons. By contrast, the longitudinal magnetization of the nuclear spins of the fat tissue protons sometimes changes very significantly from suppression module to suppression module before the appearance of the steady state condition. The image quality is thereby impaired. Among other things, the first pair of suppression modules and acquisition modules should therefore be discarded and not be used for data acquisition.

This disadvantage in particular occurs in the imaging of organs that exhibit a quasi-periodical movement (such as, for example, the lungs or the heart). In this case a PACE technique ("prospective acquisition correction"), in which the acquisition of the data is triggered by what is known as a navigator echo in order to avoid movement artifacts, is often applied to the imaging as well. Since the measurement data are for the most part acquired during movement cycles, the acquisition is triggered multiple times by a navigator echo. Given each new data acquisition during a movement cycle the problem exists that the steady state condition of the longitudinal magnetization in the fat tissue protons must first reappear. Either the measurement time is thereby significantly extended, or the suppression of signals of fat tissue protons is incomplete.

U.S. Pat. No. 5,541,514 discloses a steady state pulse sequence in which a repetition time and a flip angle are used with an alternating polarity. In the steady state condition the magnetization moves between a first value +alpha/2 and a second value −alpha/2. An RF pulse with a flip angle of alpha/2 is radiated before the beginning of the pulse sequence. A preparation of the nuclear spins is hereby achieved and the steady state condition occurs faster.

A sequence called TOMROP ("T One by Multiple Read Out Pulses") is described in the article by Brix et al., "Fast and precise T1 imaging using a TOMROP sequence", Magn. Reson. Imaging, 1990; 8(4):351-356. A train of interrogation pulses with small flip angles β generates a set of gradient echoes. A steady state condition for the longitudinal magnetization appears during this train. Before the train of interrogation pulses a selective pulse known as an α-pulse shifts the longitudinal magnetization into a defined initial state. The longitudinal magnetization develops differently dependent on the flip angle α.

SUMMARY OF THE INVENTION

An object of the present invention is to provide a method in the form of a sequence for magnetic resonance imaging that allows a good suppression of signals of nuclear spins of a specific tissue type and simultaneously enables a fast acquisition of image data. Furthermore, it is an object of the invention to provide a magnetic resonance apparatus for implementation of such a sequence.

The method for magnetic resonance imaging according to the invention, with which image data of a subject to be examined are acquired and with which signals of nuclear spins of a specific type are suppressed, includes the following steps:

(a) application of a suppression module to suppress signals of the nuclear spins of the specific type;

(b) application of an acquisition module after a wait time to acquire measurement data;

(c) repetition of the steps (a) and (b) one or more times, each after a repetition time and, (d) before the steps (a), (b) and (c), application of a spin preparation module that shifts the magnetization of the nuclear spins of the specific type into a steady state condition that is maintained through the application of the subsequent steps (a), (b) and (c).

In the sequence, the actual image data acquisition occurs during the acquisition modules. The suppression modules serve to suppress the signals of the nuclear spins of the specific type. A steady state condition (in particular in the longitudinal magnetization) is induced in the magnetization of the nuclear spins of the specific type via the repeated execution of the suppression modules. Because a spin preparation module is executed before the suppression modules, the magnetization of the nuclear spins of the specific type are shifted in advance into a state that significantly accelerates the induction of the steady state condition. In the best case the longitudinal magnetization of the nuclear spins of the specific type is already located in the steady state condition when the subsequent suppression modules are executed.

This means that a spin preparation module is executed for the purpose just described before the sequence of suppression module, acquisition module, suppression module, acquisition module etc., thus before the steps (a), (b) and (c).

The steady state condition corresponds to the state that the magnetization of the nuclear spins of the specific type occupy due to the repeated execution of the suppression and acquisition modules.

The term "nuclear spins of a specific type" as used herein means nuclear spins that exhibit a characteristic behavior (response) due to the chemical compound in which the nuclear spins are bound or the surrounding fluid or the surrounding tissue. This characteristic behavior in particular appears with regard to the relaxation times and/or the Larmor frequency.

The image quality is improved due to the inventive sequence since the magnetization (in particular the longitudinal magnetization) exhibits a constant behavior during the image data acquisition due to the steady state condition. Additionally, in this manner the image data acquisition can also be accelerated since a pre-sequence operation, that may be necessary in conventional methods to induce the steady state condition, is not necessary.

The degree of the suppressions of the signals of the nuclear spins of the specific type can be variably set. Sometimes it is advantageous when the signals are not completely suppressed, such that the nuclear spins of the specific type still appear in the image with a certain grey value. A suppression module can include, for example, an inversion pulse or even an adiabatic RF pulse to suppress the signals of the nuclear spins.

The acquisition of the measurement data during an acquisition module can ensue by a further RF pulse for excitation of nuclear magnetic resonances being interspersed, with measurement data being acquired thereafter.

In an advantageous embodiment, the nuclear spins of the specific type are nuclear spins of fat tissue protons. The often interfering strong signal from fat tissue protons can hereby be reduced or even entirely suppressed in a simple manner.

The spin preparation module advantageously includes an RF pulse. In a particularly advantageous embodiment the spin preparation module includes only a single RF pulse, possibly with matching selected slice-selection gradients and/or spoiler gradients. The spin preparation module can be executed quickly and without great effort in this manner.

In another embodiment, the RF pulse of the spin preparation module is an adiabatic RF pulse. The method is hereby particularly robust relative to B1 magnetic field inhomogeneities.

In a further embodiment the acquisition module that is executed in step (b) includes at least one RF pulse with which nuclear spins are excited to resonance. The acquisition module thereafter causes acquisition of the measurement data. The signals of the excited nuclear spins are acquired with suitable gradient fields.

In an embodiment a sequence block that includes the steps (a), (b), (c) and (d) is executed multiple times. This block executed multiple times can be respectively triggered by a navigator signal (also designated as a navigator echo). In this manner the sequence block can be used in a particularly advantageous manner for data acquisition of organs with a movement (such as, for example, heart or lungs). The movement is typically detected with the navigator signal. When the navigator signal indicates that a data acquisition is particularly advantageous (since, for example, the movement of the organs is only slightly pronounced and thus would cause only slight artifacts), the navigator signal can trigger the data acquisition via the sequence block. This means that information about the position and/or the movement of the organ to be examined is acquired with the navigator signal. When the movement and/or the position lie within certain predetermined ranges, the data acquisition ensues with the aid of the sequence block.

A further embodiment of the inventive method for the magnetic resonance imaging with which image data of a subject to be examined are acquired and with which signals of nuclear spins of a specific type are suppressed includes the following steps:

(a) application of a suppression module to suppress signals of the nuclear spins of the specific type, wherein the suppression module includes at least one first RF pulse, (b) application of an acquisition module after a wait time for acquisition of measurement data; and (c) repetition of the steps (a) and (b) one or more times, each after a repetition time, wherein a flip angle of the first RF pulse of the first suppression module is selected such that the first RF pulse of the first suppression module shifts the magnetization of the nuclear spin of the specific type into a steady state condition that is thereupon maintained through the following acquisition modules and suppression modules.

This alternative embodiment of the inventive sequence differs from the previously described embodiment by, instead of the spin preparation module, the first suppression module being fashioned such that the magnetization of the nuclear spins is shifted into a steady state condition by the first suppression module. This steady state condition is maintained through the following application of the acquisition modules and suppression modules. The nuclear spins of the specific type are shifted into the steady state condition by a matching selected flip angle of the first RF pulse.

In another embodiment the RF pulses of the second and further suppression modules are inversion pulses that invert the longitudinal magnetization of the nuclear spins of the specific type. The first RF pulses of the first and the further suppression modules can also be adiabatic RF pulses.

The comment made above with regard to the first embodiment of the inventive sequence apply in an analogous manner to the alternative embodiment of the inventive sequence.

The invention also encompasses a magnetic resonance apparatus fashioned for implementation of a sequence according to any of the embodiments described above.

BRIEF DESCRIPTION OF THE DRAWINGS

FIG. 8 illustrates the use of an inventive sequence together with a navigator signal.

DESCRIPTION OF THE PREFERRED EMBODIMENTS

Figure 1:
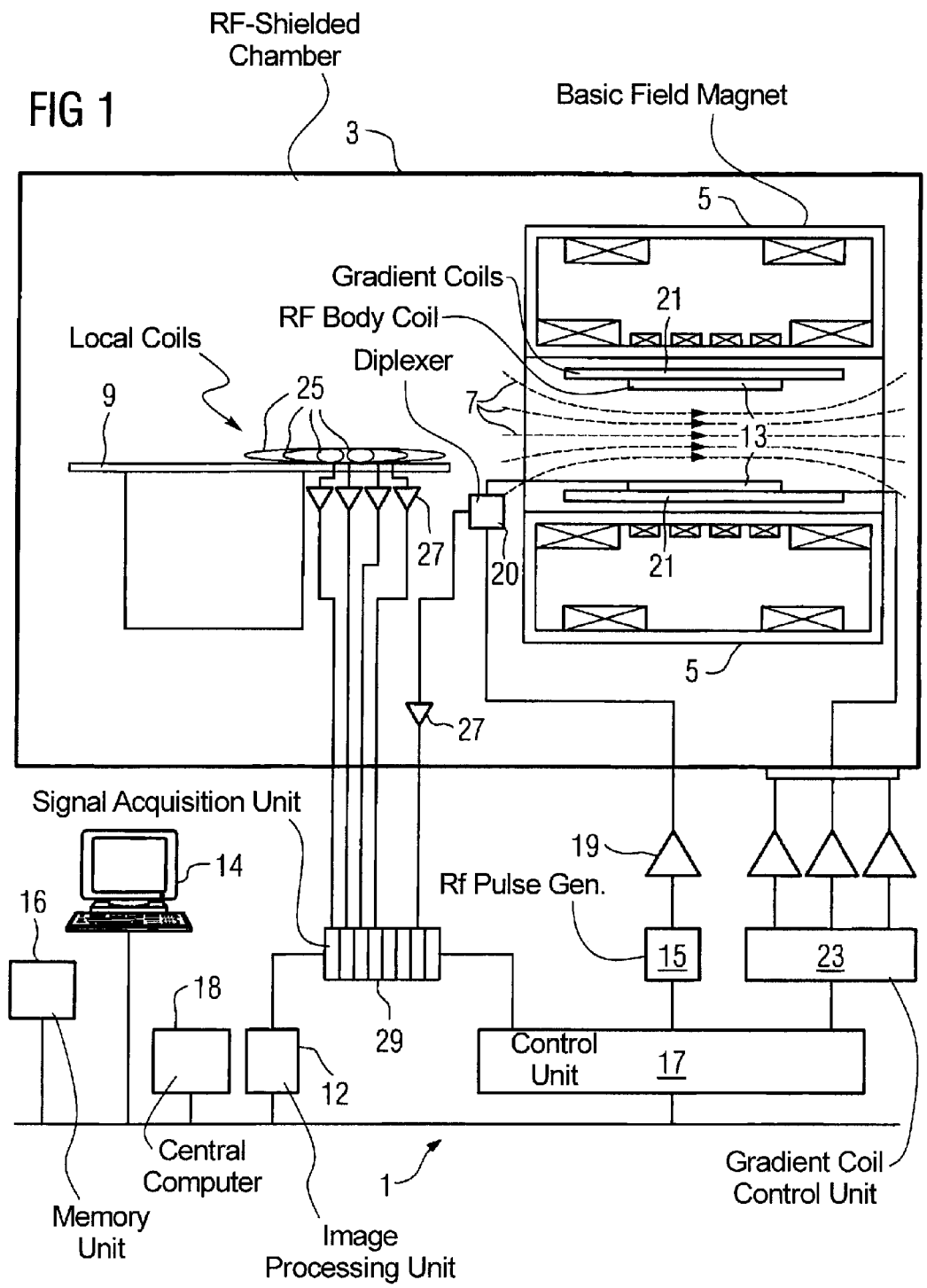
FIG. 1 schematically illustrates an MR apparatus operable in accordance with the invention.

FIG. 1 schematically shows the design of the basic components of the magnetic resonance apparatus 1. In order to examine a body by means of magnetic resonance imaging, various magnetic fields matched as precisely as possible to one another in terms of their temporal and spatial characteristics are applied.

A strong basic field magnet (typically a cryomagnet) 5 with a tunnel-shaped opening is arranged in a radio-frequency (RF) shielded measurement chamber 3, and generates a static, strong basic magnetic field 7 that is typically 0.2 Tesla to 3 Tesla and more. A body or a body part (not shown) to be examined is supported on a patient bed 9 and is positioned in a homogeneous volume of the basic magnetic field 7.

The excitation of the body ensues by radio-frequency excitation pulses that are radiated from a radio-frequency antenna (shown here as a body coil 13). The radio-frequency excitation pulses are generated by a pulse generator unit 15 that is controlled by a pulse sequence control unit 17. After amplification by a radio-frequency amplifier 19 they are conducted to the radio-frequency antenna. The radio-frequency system is only schematically indicated. Typically, more than one pulse generator unit 15, more than one radio-frequency amplifier 19 and a number of radio-frequency antennas are used in a magnetic resonance apparatus 1.

Furthermore, the magnetic resonance apparatus 1 has gradient coils 21 with which magnetic gradient fields for selective slice excitation and for spatial coding of the measurement signal are radiated in a measurement. The gradient coils 21 are controlled by a gradient coil control unit 23 that, like the pulse generator unit 15, is connected with the pulse sequence control unit 17.

The signals emitted by the excited nuclear spins are acquired by the body coil 13 and/or by local coils 25, amplified by associated radio-frequency preamplifiers 27 and processed further and digitized by a signal acquisition unit 29.

In the case of a coil that can be operated both in transmission mode and in acquisition mode (such as, for example, the body coil 13), the correct signal relaying is regulated by an upstream transmission-reception diplexer 20.

An image processing unit 12 generates from the measurement data an image that is presented to a user via a control console 14 or is stored in the memory unit 16. A central computer 18 controls the individual system components. The basic operation of such an apparatus is known in the prior art.

The computer 18 of the magnetic resonance apparatus 1 is fashioned such that data acquisition with a sequence in accordance with the invention can ensue with the magnetic resonance apparatus 1 such that signals of nuclear spins of a specific type can be suppressed.

Figure 2:
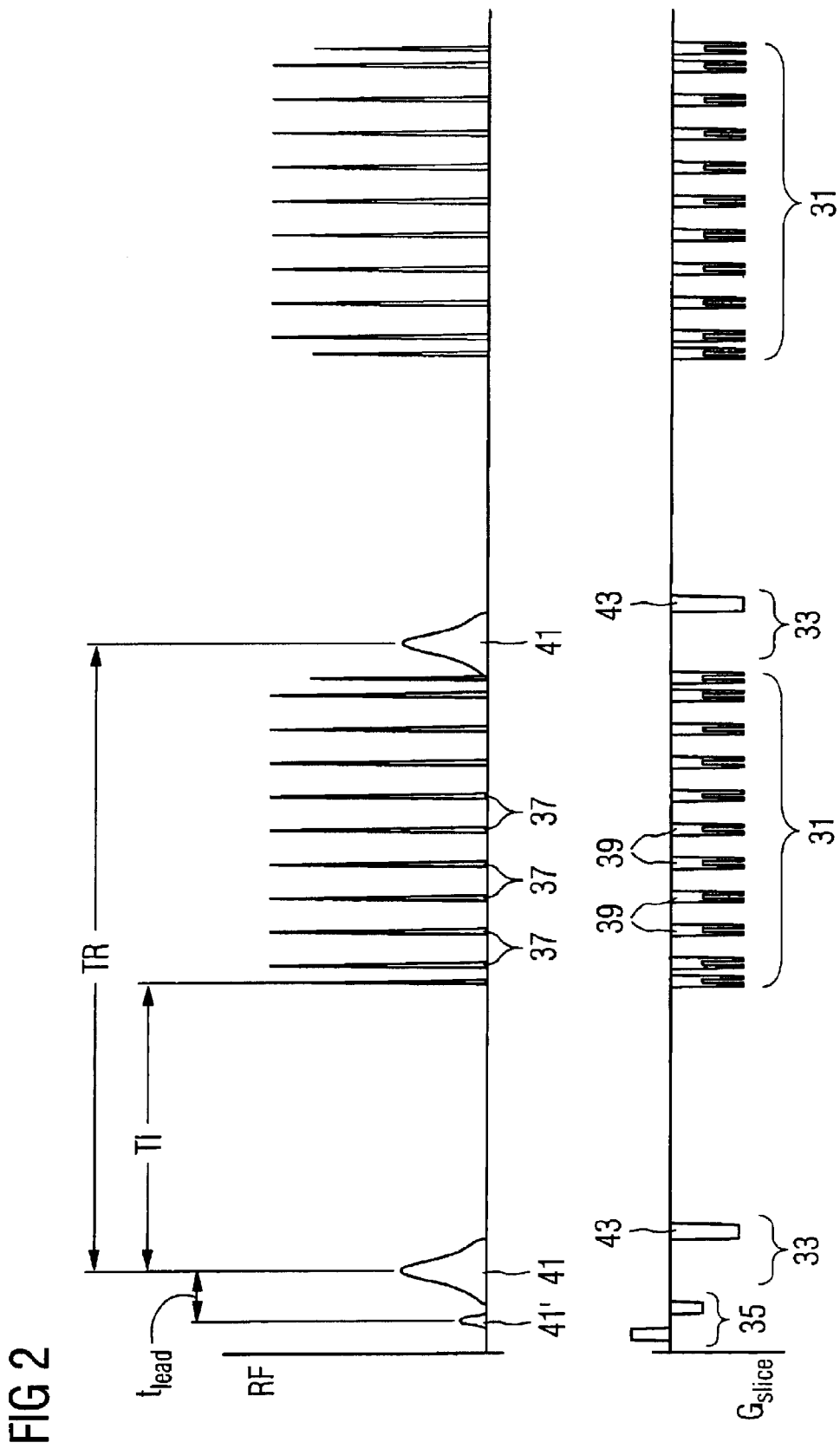
FIG. 2 shows a sequence diagram according to an embodiment of the invention.

FIG. 2 shows a schematic diagram of a first embodiment of the inventive sequence. The upper part (RF) shows a sequence of RF pulses that are radiated during the sequence. The lower part ($G_{slice}$) shows a sequence of gradient fields that are radiated contemporaneously with the RF pulses, and in fact in the slice coding direction ($G_{slice}$). Not shown are gradient fields in directions orthogonal to this as well as the scanning of the measurement signal, since this is not necessary for understanding of the invention.

Two successive acquisition modules 31 are visible during which the measurement data are respectively acquired. A series of RF pulses 37 for excitation of nuclear spins is radiated during an acquisition module 31. Specific k-space regions (for example individual k-space lines) are subsequently scanned, respectively under radiation of suitable gradient fields 39.

An acquisition module 31 can use different techniques for scanning the k-space lines, for example a spin echo technique, a turbo spin echo technique or a gradient echo technique. The individual acquisition modules 31 repeat again at the time interval of a repetition time interval with the time duration TR.

Before the acquisition modules 31 suppression modules 33 are executed at a time interval with a wait time TI (for "inversion time"). These suppression modules 22 serve to suppress the signals of nuclear spins of a specific type. For example, signals of the nuclear spins of fat tissue protons can be suppressed in this manner.

A spin preparation module 35 is executed before the sequence of the suppression modules 33 and the acquisition modules 31. The spin preparation module 35 shifts the magnetization of the nuclear spin of the specific type into a steady state condition. This steady state condition is thereupon maintained through the repeating regular execution of the suppression modules 33 and the acquisition modules 31.

The RF pulses of the spin preparation module and the suppression modules shown in FIG. 2 are adiabatic RF pulses 41', 41. Adiabatic RF pulses are amplitude-modulated and frequency-modulated pulses that are insensitive to B1 inhomogeneities. The adiabatic RF pulses are thereby frequency-selective and as such provide that predominantly nuclear spins of the specific type are excited. Their magnetization is destroyed by a radiated spoiler gradient 43. In this way the signals of the nuclear spins of the specific type contribute to the acquired signal in only a more limited scope in the subsequent acquisition module 31.

Another technique can also be used in which conventional RF pulses are employed. For example, an IR pulse (IR for "inversion recovery") that inverts the nuclear spins can be radiated in the suppression module 33 shown here. This inversion pulse can thereby be slice-selective or also pertain to the entire excitation volume of the transmission coil. The inversion time TI is dimensioned such that the longitudinal magnetization of the nuclear spins of the specific type are located at the zero crossing at the point in time of the subsequent acquisition module.

In a simple embodiment the spin preparation module 35 comprises only one RF pulse (possibly with corresponding gradient fields) that is matched for induction of the steady state condition.

If TR characterizes the repetition time of two successive acquisition modules 31, T1 the relaxation time of the nuclear spins of the specific type, $t_{lead}$ the time interval between the spin preparation module 35 and the first suppression module 33 and $\alpha$ the flip angle that is induced by the suppression modules 33, the flip angle $\beta_{prep}$ of the spin preparation module 35 is calculated from the following correlation:

$$\beta_{prep}(\alpha, TR, T1, t_{lead}) = \cos^{-1}\left[1 - \frac{1 - Mz_{ss}(\alpha, TR, T1)}{\exp(-t_{lead}/T1)}\right]$$

$Mz_{ss}(\alpha, TR, T1)$ represents the magnitude of the longitudinal magnetization of the nuclear spins of the specific type as it arises in the steady state condition. For its part it is dependent on the variables $\alpha$, TR and T1.

Figure 3:
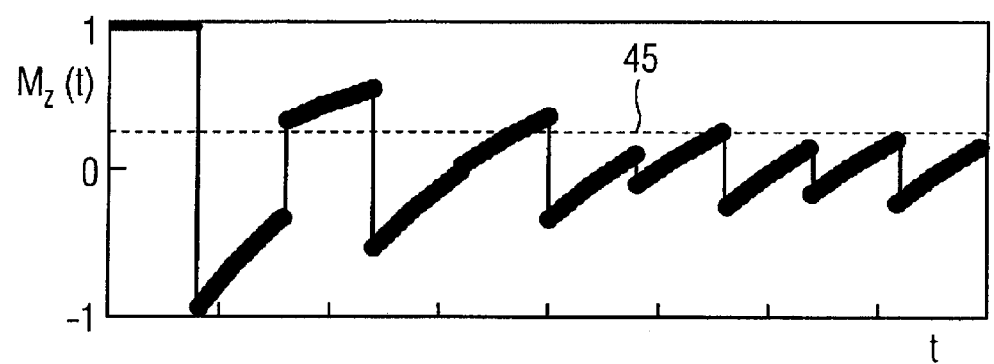
FIG. 3 and FIG. 4 show the development of the longitudinal magnetization as a function of the time in a sequence without spin preparation, and with a spin preparation, respectively.
Figure 4:
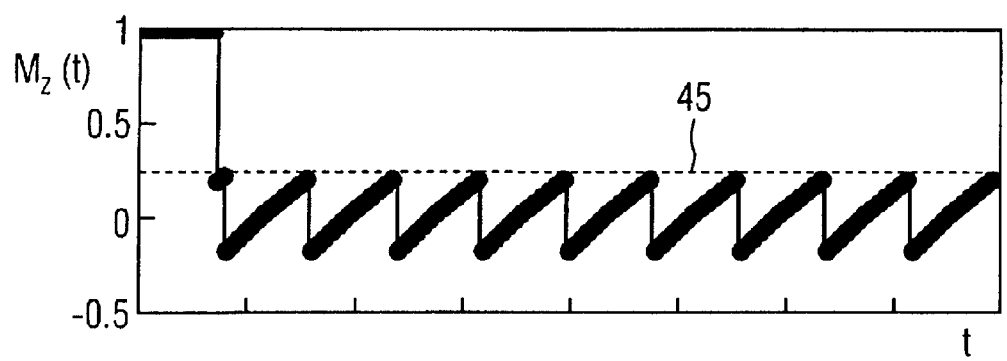

FIG. 3 and FIG. 4 show the development of the longitudinal magnetization $M_z(t)$ as a function of the time t. The sequence with a spin preparation module has been executed in FIG. 4, in contrast to without a spin preparation module in FIG. 3. The data according to FIG. 3 and FIG. 4 originate from a simulation of the temporal response of the longitudinal magnetization $M_z(t)$. The longitudinal magnetization $M_z(t)$ is inverted by successive inversion pulses. For example, this occurs in a series of suppression modules 33 in which an inversion pulse is respectively applied. The response of the longitudinal magnetization $M_z(t)$ given nine successive inversion pulses is shown.

FIG. 3 shows that the longitudinal magnetization $M_z(t)$ of the nuclear spins of the specific type only reaches a steady state condition after a few repetitions of suppression modules 33 when only inversion pulses are successively applied. The steady state condition is thereby indicated by a dashed line 45.

In contrast to this, FIG. 4 shows that an RF pulse that is radiated before the series of the inversion pulses can shift the longitudinal magnetization $M_z(t)$ into a steady state condition from the start. In this case the flip angle of the RF pulse is 60°. Here as well the steady state condition is indicated by a dashed line 45.

This shows that a steady state condition of the magnetization in the nuclear spins of the specific type can also be reached significantly more quickly in an inventive sequence according to FIG. 2 when a corresponding spin preparation module 35 is executed before the series of suppression modules 33 and acquisition modules 31. In the ideal case the magnetization is thereby located from the outset in a steady state condition. As presented, in a simple case the spin preparation module 35 can comprise only a single correspondingly fashioned RF pulse 41'.

Figure 5:
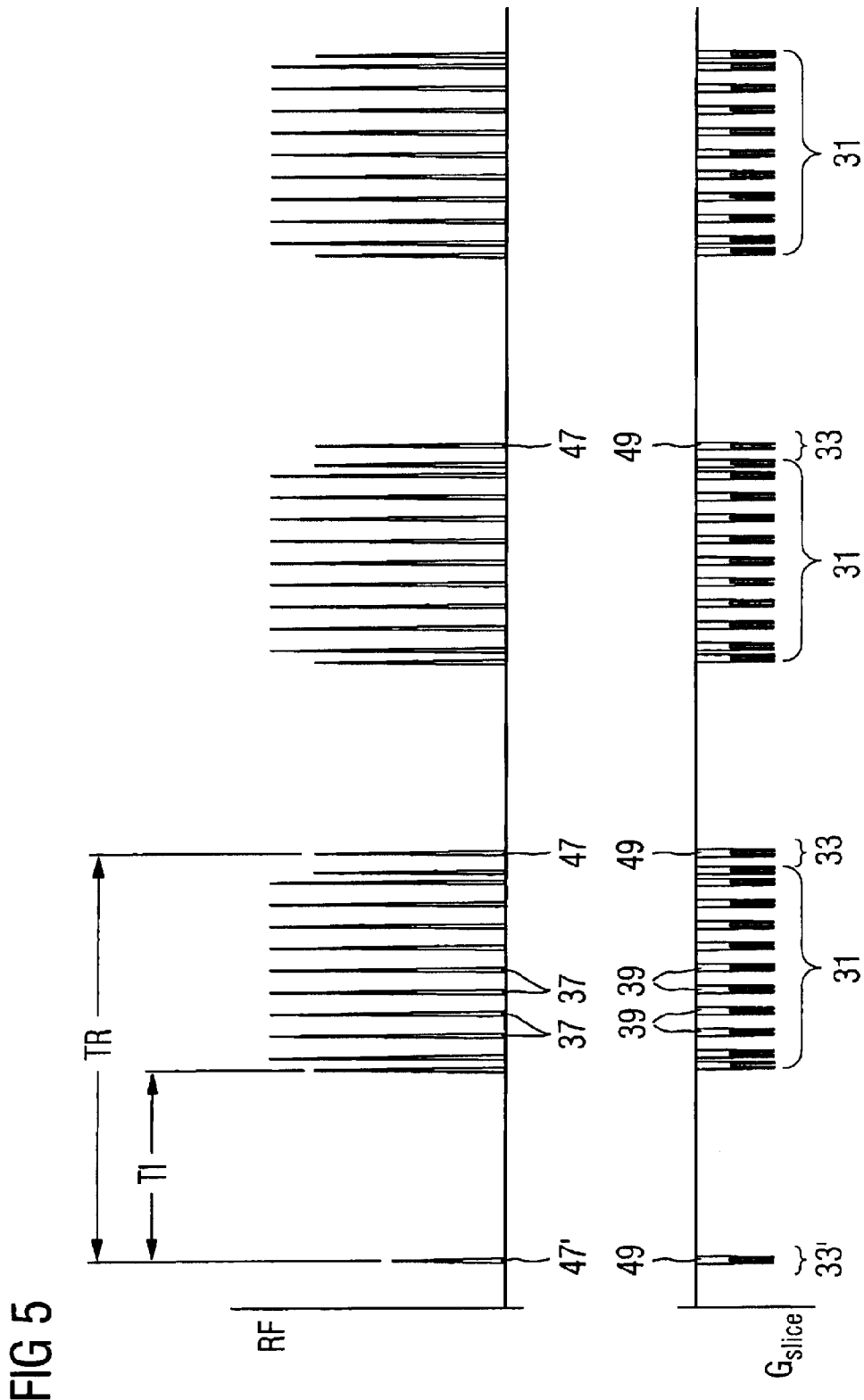
FIG. 5 shows a sequence diagram according to a further embodiment of the invention.

FIG. 5 shows a sequence according to a further embodiment of the invention. It is similar to the sequence that is shown in FIG. 2. In contrast to the sequence shown in FIG. 2, the employed RF pulses 47, 47' of the suppression modules 33, 33' are conventional RF pulses. Gradient fields 49 fashioned to match the RF pulses 47, 47' are radiated. Adiabatic RF pulses can also be used here instead of the conventional RF pulses.

Furthermore, a spin preparation module is absent in this sequence. Instead of this, the RF pulse 47' of the first suppression module 33' differs from the RF pulses 47 of the further suppression modules 33. It is designed to cause the longitudinal magnetization of the nuclear spins of a specific type (for example of fat tissue protons) to be shifted into a steady state condition right at the beginning of the sequence, and the steady state condition is maintained through the following suppression modules 33 and the acquisition modules 31.

The following relationship describes how the flip angle of the RF pulse 47' of the first suppression module 33' can be calculated so that the longitudinal magnetization is shifted into a steady state condition at the beginning of the sequence.

TR represents the repetition time of two successive acquisition modules, T1 the relaxation time of the nuclear spins of the specific type and $\alpha$ the flip angle that is induced by the suppression modules. The flip angle $\beta_{first}$ of the first suppression module is calculated according to:

$$\beta_{first}(\alpha, TR, T1) = \cos^{-1}\left[1 - \frac{1 - Mz_{ss}(\alpha, TR, T1)}{\exp(TR/T1)}\right].$$

$Mz_{ss}(\alpha, TR, T1)$ represents the magnitude of the longitudinal magnetization of the nuclear spins of the specific type as it arises in the steady state condition. It is dependent on the variables $\alpha$, TR and T1.

Figure 6:
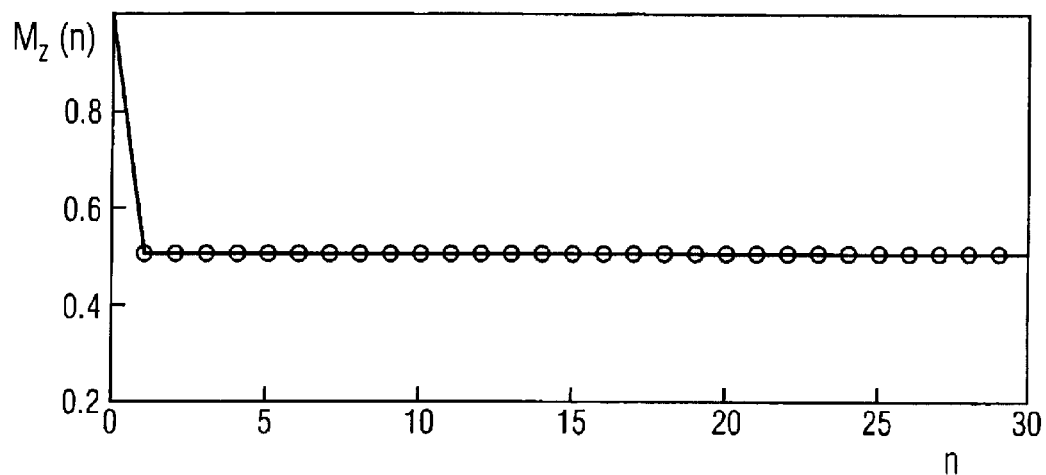
FIG. 6 and FIG. 7 show the development of the longitudinal magnetization as a function of the time given a sequence with a series of 180° inversion pulses, wherein in FIG. 6 the first RF pulse is fashioned for spin preparation and in FIG. 7 it is not.
Figure 7:
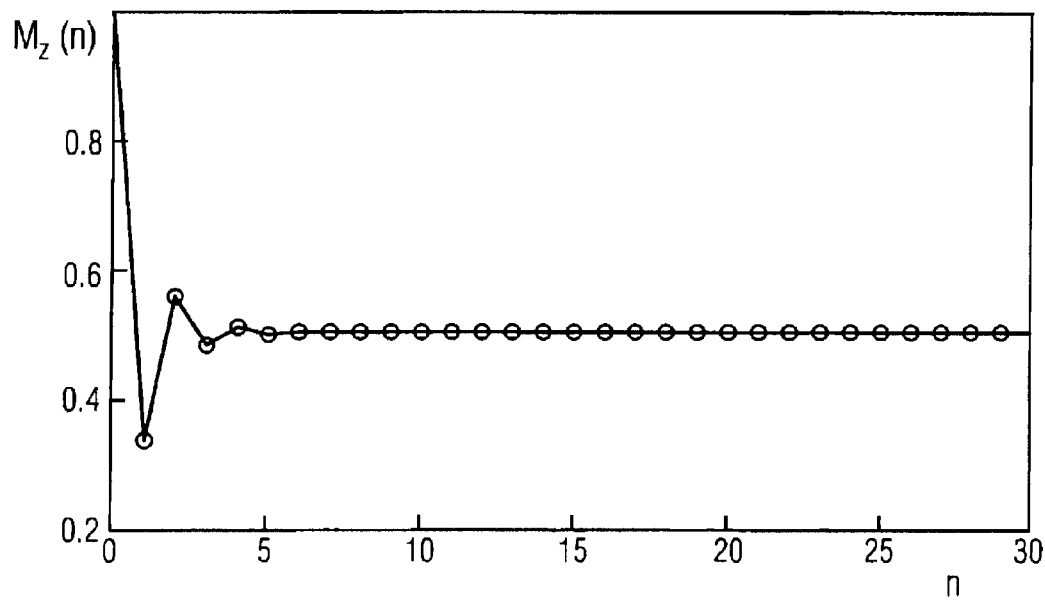

FIG. 6 and FIG. 7 show the development of the longitudinal magnetization $M_z(n)$ as a function of the number n of the RF pulses in a sequence with a series of 180° inversion pulses. The shown development of the longitudinal magnetization is derived from a simulation. The value of the longitudinal magnetization is shown immediately before an RF pulse 47 of a saturation module 33 (circle).

While the RF pulse of the first suppression module is fashioned for spin preparation in FIG. 6, this is not the case in FIG. 7. The difference is clearly recognizable. While in FIG. 6 the steady state condition has already been reached after the second RF pulse, in FIG. 7 the steady state condition is only reached after at least five RF pulses.

FIG. 8 shows a special embodiment of the inventive sequences in which the beginning of such a sequence is prospectively triggered by a navigator signal 51. Such an embodiment is advantageous in, for example, the imaging of organs that are subject to a quasi-periodic movement. By means of the navigator signal 51 the points in time can be established at which only slight artifacts are caused by the movement. If the inventive sequence is used in a block 53 for acquisition of the image data, no wait time is necessary in which a steady state condition of the longitudinal magnetization of the nuclear spins to be suppressed must arise. The time window 55 in which an acquisition of the measurement data can occur can hereby be entirely utilized.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a magnetic resonance imaging apparatus comprising the steps of:
   (a) exposing an examination subject to a suppression module, comprised of a first set of at least one electromagnetic pulse, that suppresses magnetic resonance signals emanating from the examination subject that originate from nuclear spins of a predetermined type;
   (b) exposing the examination subject to an acquisition module, comprised of a second set of at least one electromagnetic pulse, after a wait time following exposure to said suppression module, to acquire magnetic resonance measurement data from the examination subject;
   (c) repeating steps (a) and (b) at least one time, each repetition occurring after a repetition time; and
   (d) before steps (a), (b) and (c), exposing the examination subject to a spin preparation module, comprised of a third set of at least one electromagnetic pulse, which shifts magnetization of said nuclear spins of said predetermined type into a steady state condition that is maintained during steps (a), (b) and (c).

2. A method as claimed in claim 1 comprising employing a third set of at least one electromagnetic pulse in said spin preparation module that shift the longitudinal magnetization of said nuclear spins of said predetermined type.

3. A method as claimed in claim 2 comprising employing a third set of at least one electromagnetic pulse as said spin preparation module that comprises an RF pulse.

4. A method as claimed in claim 3 comprising employing a third set of at least one electromagnetic pulse as said spin preparation module that comprises a single RF pulse.

5. A method as claimed in claim 3 comprising employing a third set of at least one electromagnetic pulse as said spin preparation module that comprises an adiabatic RF pulse.

6. A method as claimed in claim 1 comprising selecting said first set of at least one electromagnetic pulse that form said suppression module to suppress fat tissue protons as said nuclear spins of said predetermined type.

7. A method as claimed in claim 1 comprising employing a first set of at least one electromagnetic pulse as said suppression module that includes a radio-frequency pulse selected from the group consisting of a radio-frequency pulse for inversion of nuclear spins and an adiabatic RF pulse.

8. A method as claimed in claim 1 comprising employing a second set of at least one electromagnetic pulse in said acquisition module that comprises at least one RF pulse for excitation of nuclear spins and a subsequent subset of said second set for measurement data acquisition.

9. A method as claimed in claim 1 comprising formulating a pulse block comprising said first, second and third sets of at least one electromagnetic pulse and executing said pulse block multiple times.

10. A method as claimed in claim 9 comprising triggering each execution of said pulse block with a navigator echo.

11. A method for magnetic resonance imaging comprising the steps of:
   (a) exposing an examination subject to a suppression module, comprising a first set of at least one electromagnetic pulse including at least one RF pulse, to suppress magnetic resonance signals originating from nuclear spins of a predetermined type;
   (b) exposing the examination subject to an acquisition module, comprised of a second electromagnetic pulse set, after a wait time following exposure of the examination subject to the suppression module, for acquisition of magnetic resonance measurement data;
   (c) repeating steps (a) and (b) at least one time, each repetition occurring after a repetition time; and
   (d) selecting a flip angle of said RF pulse in the first suppression module to shift magnetization of the nuclear spins of said predetermined type into a steady state condition that is maintained during the acquisition module and the suppression module in each repetition.

12. A method as claimed in claim 11 comprising selecting said flip angle of said RF pulse to shift the longitudinal magnetization of said nuclear spins of said predetermined type.

13. A method as claimed in claim 11 comprising, in each repetition of step (a) in step (c), generating said RF pulse as a pulse selected from the group consisting of RF pulses for inversion of the nuclear spins of the predetermined type and adiabatic RF pulses.

14. A method as claimed in claim 11 comprising selecting said first electromagnetic pulse set of said suppression module to suppress fat tissue protons as said nuclear spins of said predetermined type.

15. A method as claimed in claim 11 comprising employing a second set of electromagnetic pulses in said acquisition module that comprises at least one RF pulse for excitation of nuclear spins and a subsequent subset of said second set for measurement data acquisition.

16. A method as claimed in claim 11 comprising formulating a pulse block comprising said first, second and third sets of at least one electromagnetic pulse and executing said pulse block multiple times.

17. A method as claimed in claim 16 comprising triggering each execution of said pulse block with a navigator echo.

18. A magnetic resonance apparatus comprising:
   a magnetic resonance scanner having a coil arrangement to expose an examination subject to electromagnetic pulses to excite nuclear spins in the examination subject and to acquire magnetic resonance signals resulting from the excited nuclear spins; and
   a control unit that operates said magnetic resonance scanner by (a) exposing an examination subject to a suppression module, comprised of a first set of at least one electromagnetic pulse, that suppresses magnetic resonance signals emanating from the examination subject that originate from nuclear spins of a predetermined type, (b) exposing the examination subject to an acquisition module, comprised of a second set of at least one electromagnetic pulse, after a wait time following exposure to said suppression module, to acquire magnetic resonance measurement data from the examination subject, (c) repeating steps (a) and (b) at least one time, each repetition occurring after a repetition time, and (d) before steps (a), (b) and (c), exposing the examination subject to a spin preparation module, comprised of a third set of at least one electromagnetic pulse, that shifts magnetization of said nuclear spins of said predetermined type into a steady state condition that is maintained during steps (a), (b) and (c).

19. A magnetic resonance apparatus comprising:
   a magnetic resonance scanner having a coil arrangement to expose an examination subject to electromagnetic pulses to excite nuclear spins in the examination subject and to acquire magnetic resonance signals resulting from the excited nuclear spins; and a control unit that operates said magnetic resonance scanner by (a) exposing an examination subject to a suppression module, comprising a first set of at least one electromagnetic pulse including at least one RF pulse, to suppress magnetic resonance signals originating from nuclear spins of a predetermined type, (b) exposing the examination subject to an acquisition module, comprised of a second electromagnetic pulse set, after a wait time following exposure of the examination subject to the suppression module, for acquisition of magnetic resonance measurement data, (c) repeating steps (a) and (b) at least one time, each repetition occurring after a reaction time, and (d) selecting a flip angle of said RF pulse in the first suppression module to shift magnetization of the nuclear spins of said predetermined type into a steady state condition that is maintained during the acquisition module and the suppression module in each repetition.

* * * * *